US012693313B2

(12) United States Patent
Fujii et al.

(10) Patent No.: US 12,693,313 B2
(45) Date of Patent: Jul. 28, 2026

(54) TESTING DEVICE, TESTING METHOD, AND NON-TRANSITORY STORAGE MEDIUM STORING TESTING PROGRAM

(71) Applicant: SUMITOMO ELECTRIC INDUSTRIES, LTD., Osaka (JP)

(72) Inventors: Kosuke Fujii, Osaka (JP); Koichi Koyama, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 318 days.

(21) Appl. No.: 18/494,058

(22) Filed: Oct. 25, 2023

(65) Prior Publication Data

US 2024/0142495 A1 May 2, 2024

(30) Foreign Application Priority Data

Oct. 28, 2022 (JP) ................................. 2022-173594

(51) Int. Cl.
G01R 1/067 (2006.01)
G01B 11/06 (2006.01)
G01R 31/26 (2020.01)

(52) U.S. Cl.
CPC .......... G01R 1/06794 (2013.01); G01B 11/06 (2013.01); G01R 1/06711 (2013.01); G01R 31/2637 (2013.01)

(58) Field of Classification Search
CPC ............ G01R 1/06794; G01R 1/06711; G01R 31/2637; G01B 11/06
See application file for complete search history.

(56) References Cited

U.S. PATENT DOCUMENTS

| | | | | |
|---|---|---|---|---|
| 8,953,177 B2 * | 2/2015 | Tsai | ....................... | G01B 5/207 |
| | | | | 356/630 |
| 2001/0046715 A1 | 11/2001 | Takemoto et al. | | |
| 2005/0253613 A1 * | 11/2005 | Komatsu | ........... | G01R 31/2891 |
| | | | | 324/750.22 |
| 2006/0097743 A1 * | 5/2006 | Komatsu | ........... | G01R 31/2891 |
| | | | | 324/750.17 |
| 2014/0203168 A1 * | 7/2014 | Iwata | ................... | H03K 17/968 |
| | | | | 250/208.1 |
| 2015/0311003 A1 * | 10/2015 | Fitzgerald | .......... | H01H 59/0009 |
| | | | | 200/181 |
| 2017/0205443 A1 * | 7/2017 | Bolt | ................... | G01R 1/06794 |
| 2019/0227102 A1 * | 7/2019 | Frankel | .................... | G01R 1/08 |

FOREIGN PATENT DOCUMENTS

| | | | | |
|---|---|---|---|---|
| JP | 2002-250744 A | 9/2002 | | |
| JP | 5912395 B2 * | 4/2016 | ............. | G01S 17/88 |

OTHER PUBLICATIONS

Translation of JP 5912395 B2 (Year: 2016).*

* cited by examiner

*Primary Examiner* — Paresh Patel
(74) *Attorney, Agent, or Firm* — Volpe Koenig

(57) ABSTRACT

A testing device includes a contactless measurement unit configured to measure a thickness of a test object and a probe needle configured to move by a distance in accordance with the thickness measured by the measurement unit to come into contact with an electrode of the test object.

11 Claims, 11 Drawing Sheets

10

Control unit

| | |
|---|---|
| | Movement control unit — 55 |
| 51 — Arm control unit | Light source control unit — 56 |
| 52 — Posture control unit | Power source control unit — 57 |
| 53 — Temperature control unit | Alignment control unit — 58 |
| 54 — Measurement control unit | Testing unit — 59 |

10

60 — CPU     RAM — 62     ROM — 63

64 — Storage device          Interface — 66

72          T2          11

70          T1

TESTING DEVICE, TESTING METHOD, AND NON-TRANSITORY STORAGE MEDIUM STORING TESTING PROGRAM

CROSS REFERENCE TO RELATED APPLICATIONS

This application claims priority based on Japanese Patent Application No. 2022-173594 filed on Oct. 28, 2022, and the entire contents of the Japanese patent application are incorporated herein by reference.

TECHNICAL FIELD

The present disclosure relates to a testing device, a testing method, and a non-transitory storage medium storing testing program.

BACKGROUND

A device such as an optical modulation element is inspected. In the inspection, a probe needle is brought into contact with an electrode of an apparatus (for example, PTL 1).

[Patent Document 1] Japanese Unexamined Patent Application Publication No. 2002-250744

SUMMARY

A testing device according to the present disclosure includes a contactless measurement unit configured to measure a thickness of a test object and a probe needle configured to move by a distance in accordance with the thickness measured by the measurement unit to come into contact with an electrode of the test object.

A testing method according to the present disclosure includes contactlessly measuring a thickness of a test object and causing a probe needle to move by a distance in accordance with the measured thickness to come into contact with an electrode of the test object.

A non-transitory storage medium storing testing program according to the present disclosure causes a computer to function as a measurement control unit configured to contactlessly measure a thickness of a test object and a movement control unit configured to cause a probe needle to move by a distance in accordance with the measured thickness to come into contact with an electrode of the test object.

DETAILED DESCRIPTION

Figure 1:
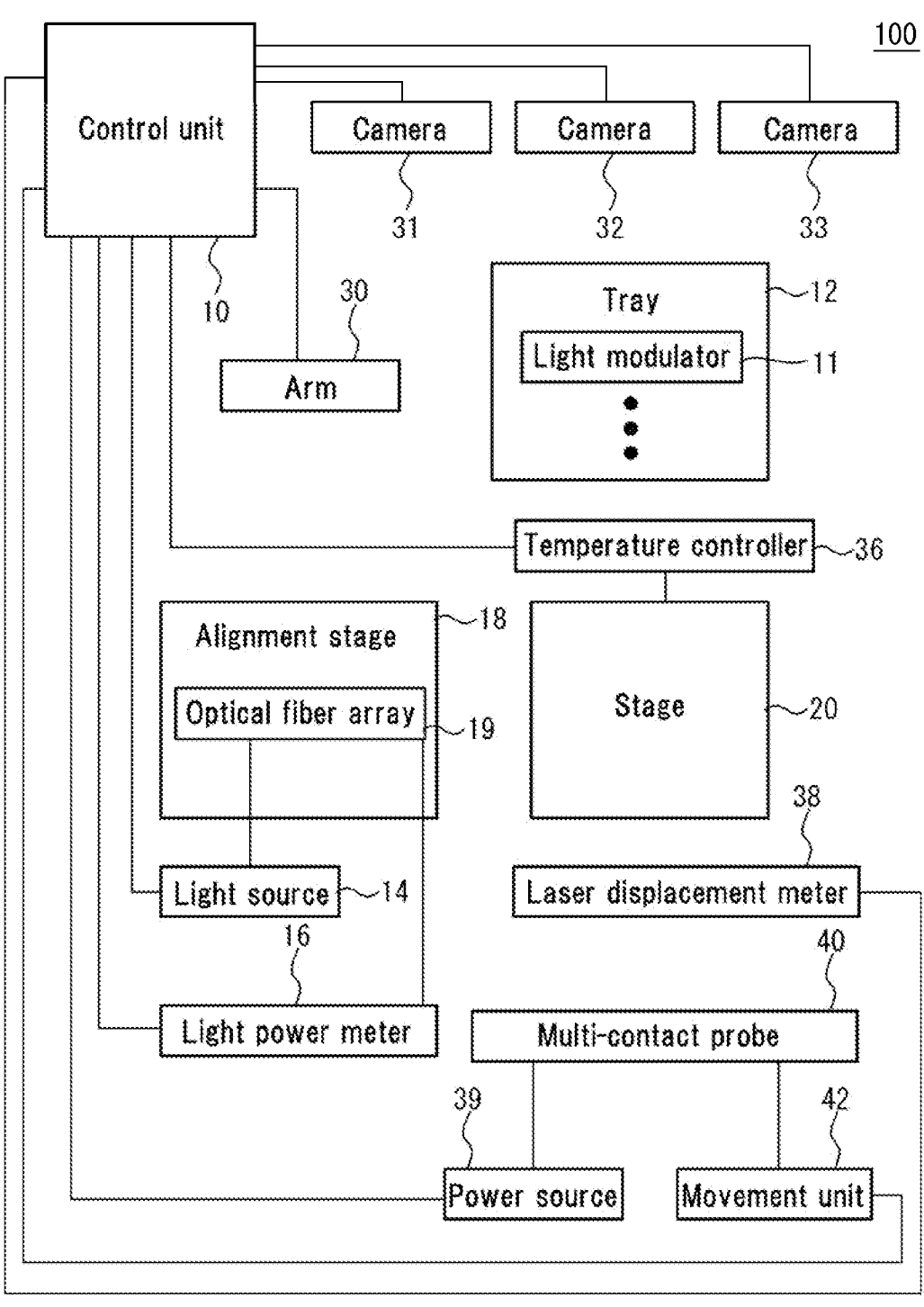
FIG. 1 illustrates a schematic diagram illustrating a testing device according to an embodiment.

When the probe needle is brought into contact with the electrode, the probe needle is lowered toward the electrode. After the probe needle comes into contact with the electrode, the probe needle is further lowered to slide on a surface of the electrode. Due to manufacturing tolerances and the like, variations in device thickness may occur. When the device is thin, the contact between the probe needle and the electrode becomes unstable. If the device is thick, the amount by which the probe needle is pushed into the electrode increases and the electrode may be destroyed. Therefore, it is an object of the present disclosure to provide a testing device, a testing method, and a testing program that enable good contact between a probe needle and an electrode.

DESCRIPTION OF EMBODIMENTS OF THE PRESENT DISCLOSURE

First, the contents of embodiments of the present disclosure will be listed and explained.

(1) An embodiment of the present disclosure is (1) a testing device including a contactless measurement unit configured to measure a thickness of a test object and a probe needle configured to move by a distance in accordance with the thickness measured by the measurement unit to come into contact with an electrode of the test object. Since the probe needle moves by a distance corresponding to the thickness, contact failure between the probe needle and the electrode is suppressed. Good contact between the probe needle and the electrode is possible.

(2) In the embodiment of the present disclosure, a stage on which the test object is to be disposed and a movement unit configured to cause the probe needle to move are included. The movement unit may be configured to dispose the probe needle at a position above the stage and separated from the stage, and to cause the probe needle to move by a distance in accordance with a height from the stage to the probe needle and the thickness. The probe needle is moved from an area above the stage to the electrode. Good contact between the probe needle and the electrode is possible.

(3) In the embodiment of the present disclosure, the movement unit may be configured to acquire the distance by adding a predetermined value to a difference between the height and the thickness, and to cause the probe needle to move by the distance. The probe needle slides on a surface of the electrode. Good contact between the probe needle and the electrode is possible.

(4) In the embodiment of the present disclosure, the test object may has a plurality of the electrodes, and the measurement unit may be configured to measure the thickness by irradiating at least one electrode of the plurality of the electrodes with laser light. Good contact between the probe needle and the electrode is possible. The testing time is reduced.

(5) In the embodiment of the present disclosure of (4), a plurality of the probe needles are included. The plurality of the probe needles may be configured to move by distances in accordance with the thickness to come into contact with the plurality of the electrodes. Good contact between the plurality of probe needles and the plurality of electrodes is possible.

(6) In the embodiment of the present disclosure of (4), the measurement unit may be configured to measure the thickness by irradiating a central portion of the electrodes with the laser light. Good contact between the plurality of probe needles and the plurality of electrodes is possible.

(7) In the embodiment of the present disclosure, the test object may be a light modulator. A testing of the light modulator is possible.

(8) An embodiment of the present disclosure is a testing method including contactlessly measuring a thickness of a test object and causing a probe needle to move by a distance in accordance with the measured thickness to come into contact with an electrode of the test object. Good contact between the probe needle and the electrode is possible.

(9) An embodiment of the present disclosure is a non-transitory storage medium storing testing program for causing a computer to function as a measurement control unit configured to contactlessly measure a thickness of a test object and a movement control unit configured to cause a probe needle to move by a distance in accordance with the measured thickness to come into contact with an electrode of the test object. Good contact between the probe needle and the electrode is possible.

DETAILS OF EMBODIMENTS OF THE PRESENT DISCLOSURE

Specific examples of the testing device, the testing method, and the testing program according to the embodiments of the present disclosure will be described below with reference to FIGS. The present disclosure is not limited to these examples, and is defined by the scope of the claims, and is intended to include all modifications within the meaning and scope equivalent to the scope of the claims.

(Testing Device)

FIG. 1 is a schematic diagram illustrating a testing device 100 according to an embodiment. Testing device 100 includes a control unit 10, a tray 12, a light source 14, a light power meter 16, an alignment stage 18, a stage 20, an arm 30, a camera 31, a camera 32, a camera 33, a temperature controller 36, a laser displacement meter 38 (measurement unit), a power source 39, a multi-contact probe 40, and a movement unit 42.

A plurality of light modulators 11 (test objects) are arranged in tray 12. Light modulator 11 includes an electrode, a semiconductor layer, and the like. The semiconductor layer may be formed of a compound semiconductor such as indium phosphide (InP). The electrode is provided on a surface of light modulator 11 and is made of metal such as gold (Au).

Arm 30 moves one of light modulators 11 placed on tray 12 to stage 20. Stage 20 includes a plurality of stages and can adjust the position of light modulator 11. Stage 20 may be provided with a heater. Temperature controller 36 includes a power source, and controls power input to the heater provided in stage 20. Power to the heater is turned on and off to control the temperature of light modulator 11.

Camera 31, camera 32, and camera 33 capture images of light modulator 11. The image is used for position recognition and posture control of light modulator 11.

An optical fiber array 19 is disposed on alignment stage 18. Optical fiber array 19 includes a plurality of optical fibers. Some of the plurality of optical fibers are optically connected to light source 14. Light source 14 is a wavelength variable light source and is a semiconductor laser element or the like. Another part of the plurality of optical fibers is optically connected to light power meter 16. Alignment stage 18 moves optical fiber array 19 to perform alignment with light modulator 11 disposed on stage 20.

Laser displacement meter 38 measures a distance to an object, a thickness of the object and the like of the object by irradiating the object with laser light.

Multi-contact probe 40 has a plurality of probe needles and is attached to movement unit 42. Movement unit 42 is, for example, a columnar movable component, and moves and stops multi-contact probe 40. Power source 39 is, for example, a DC power source (direct current power source), and is electrically connected to multi-contact probe 40.

Control unit 10 is a computer such as a personal computer (PC), and controls testing device 100. Control unit 10 is electrically connected to light source 14, light power meter 16, alignment stage 18, stage 20, arm 30, camera 31, camera 32, camera 33, temperature controller 36, laser displacement meter 38, power source 39, and movement unit 42.

Figure 2A:
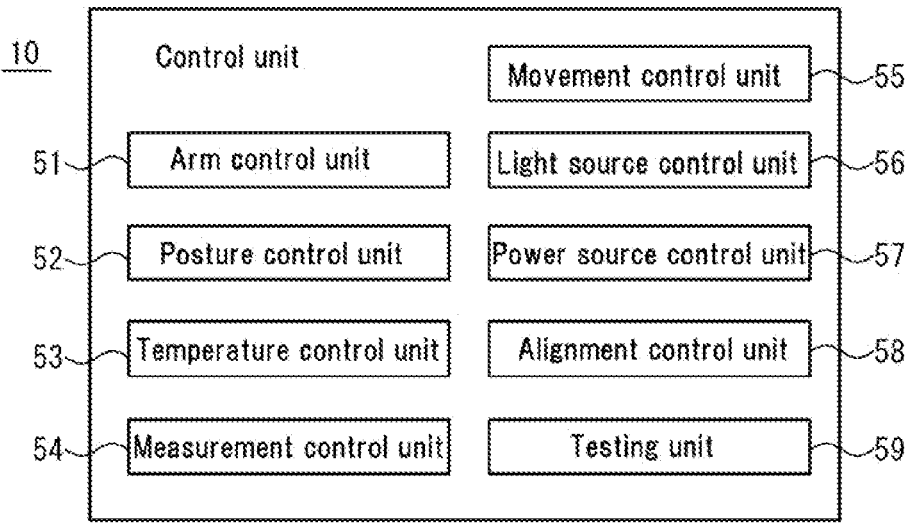
FIG. 2A illustrates a functional block diagram illustrating a configuration of the control unit.

FIG. 2A is a functional block diagram illustrating a configuration of control unit 10. Control unit 10 functions as an arm control unit 51, a posture control unit 52, a temperature control unit 53, a measurement control unit 54, a movement control unit 55, a light source control unit 56, a power source control unit 57, an alignment control unit 58, and a testing unit 59.

An arm control unit 51 controls arm 30. Arm control unit 51 moves arm 30 to turn on and off suction with arm 30. Posture control unit 52 operates stage 20 and controls the posture of light modulator 11 placed on stage 20. Temperature control unit 53 controls temperature controller 36 to adjust the temperature of stage 20.

Measurement control unit 54 performs emission and stop of laser light from laser displacement meter 38, and acquires data from laser displacement meter 38. Movement control unit 55 controls movement unit 42 to adjust the position of multi-contact probe 40. Movement control unit 55 may determine a moving amount of multi-contact probe 40.

Light source control unit 56 performs emission, stop and the like of light from light source 14, and controls the wavelength of light. Power source control unit 57 may change the voltage by inputting and stopping the DC voltage from power source 39 to multi-contact probe 40. Alignment control unit 58 operates alignment stage 18 to align optical fiber array 19 with light modulator 11. Testing unit 59 tests light modulator 11 based on the measurement result of light power meter 16 and the like.

Figure 2B:
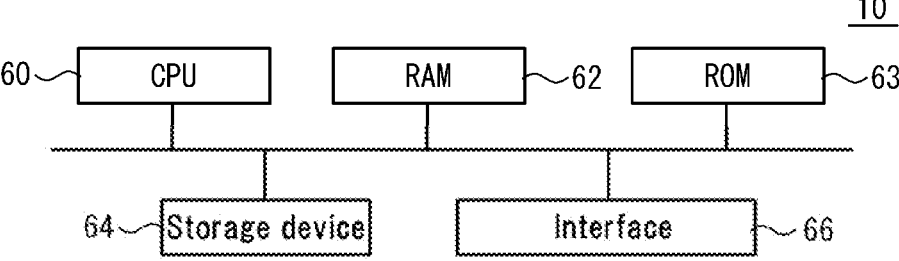
FIG. 2B illustrates a block diagram illustrating a hardware configuration of the control unit.

FIG. 2B is a block diagram showing a hardware configuration of control unit 10. As shown in FIG. 2B, control unit 10 includes a central processing unit (CPU) 60, a random access memory (RAM) 62, a read only memory (ROM) 63, a storage device 64, and an interface 66. CPU 60, RMA 62, a ROM 63, storage device 64, and interface 66 are connected to each other via a bus or the like. RAM 62 is a volatile memory that temporarily stores programs, data, and the like. Storage device 64 is a solid state drive (SSD) such as a flash memory, a hard disk drive (HHD), or the like. Storage device 64 stores programs and the like.

When the CPU 60 executes a program stored in the RAM 62, an arm control unit 51, a posture control unit 52, a temperature control unit 53, a measurement control unit 54, a movement control unit 55, a light source control unit 56, a power source control unit 57, an alignment control unit 58, and a testing unit 59 are executed in the control unit 10. Each unit of the control unit 10 may be hardware such as a circuit.

Figure 3A:
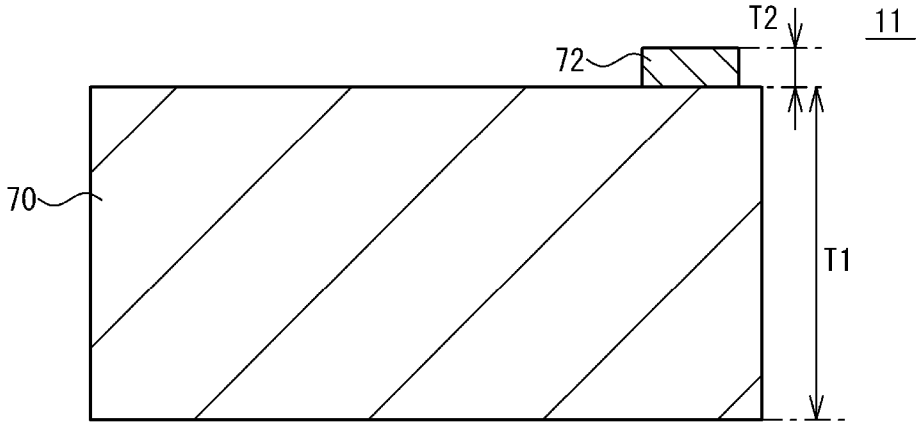
FIG. 3A illustrates a cross-sectional view illustrating a method of producing the light modulator.
Figure 3B:
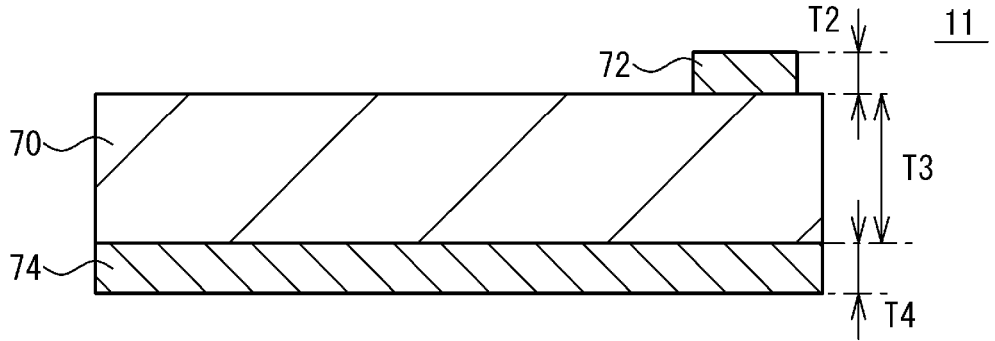
FIG. 3B illustrates a cross-sectional view illustrating a method of producing the light modulator.

FIGS. 3A and 3B are cross-sectional views illustrating a method of producing light modulator 11. FIGS. 3A and 3B show a state after completion of surface processing such as growth of a semiconductor layer and formation of an electrode. As shown in FIG. 3A, an electrode 72 is formed on the upper face of a substrate 70 of light modulator 11 by vacuum deposition or the like. Substrate 70 is formed of a semiconductor such as InP and includes a waveguide and the like. Substrate 70 has a thickness T1 of 350 μm, for example. Electrode 72 is made of metal such as gold (Au). A thickness T2 of electrode 72 is, for example, 3.5 μm to 4.5 μm. As shown in FIG. 3B, substrate 70 is thinned by grinding from the bottom face. Ground substrate 70 has a thickness T3 of about 160 μm. After grinding, an electrode 74 is formed on the lower face of substrate 70. A thickness T4 of electrode 74 is, for example, 5.7 μm to 6.9 μm.

The tolerance of the thickness of electrode 72 is, for example, 1 μm. The tolerance of the thickness of electrode 74 is, for example, 1.2 μm. The thickness of substrate 70 is within a range of +10 μm and −5 μm centered on 160 μm, for example. Manufacturing tolerances cause variations in the thickness of light modulator 11. The variation in thickness between wafers is, for example, 21.4 μm at a maximum and 4.2 μm at a minimum.

Figure 4:
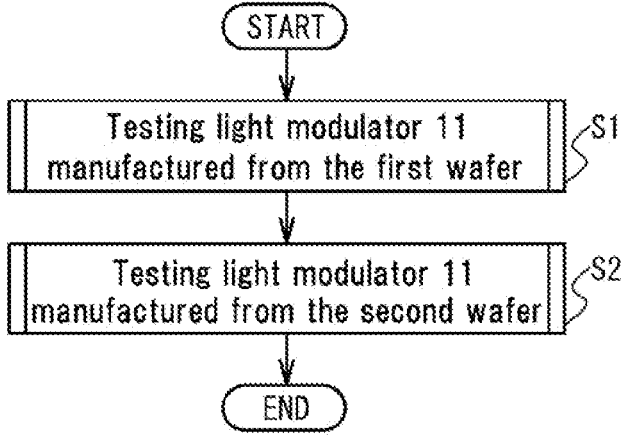
FIG. 4 illustrates a flow chart illustrating steps of the testing.
Figure 5:
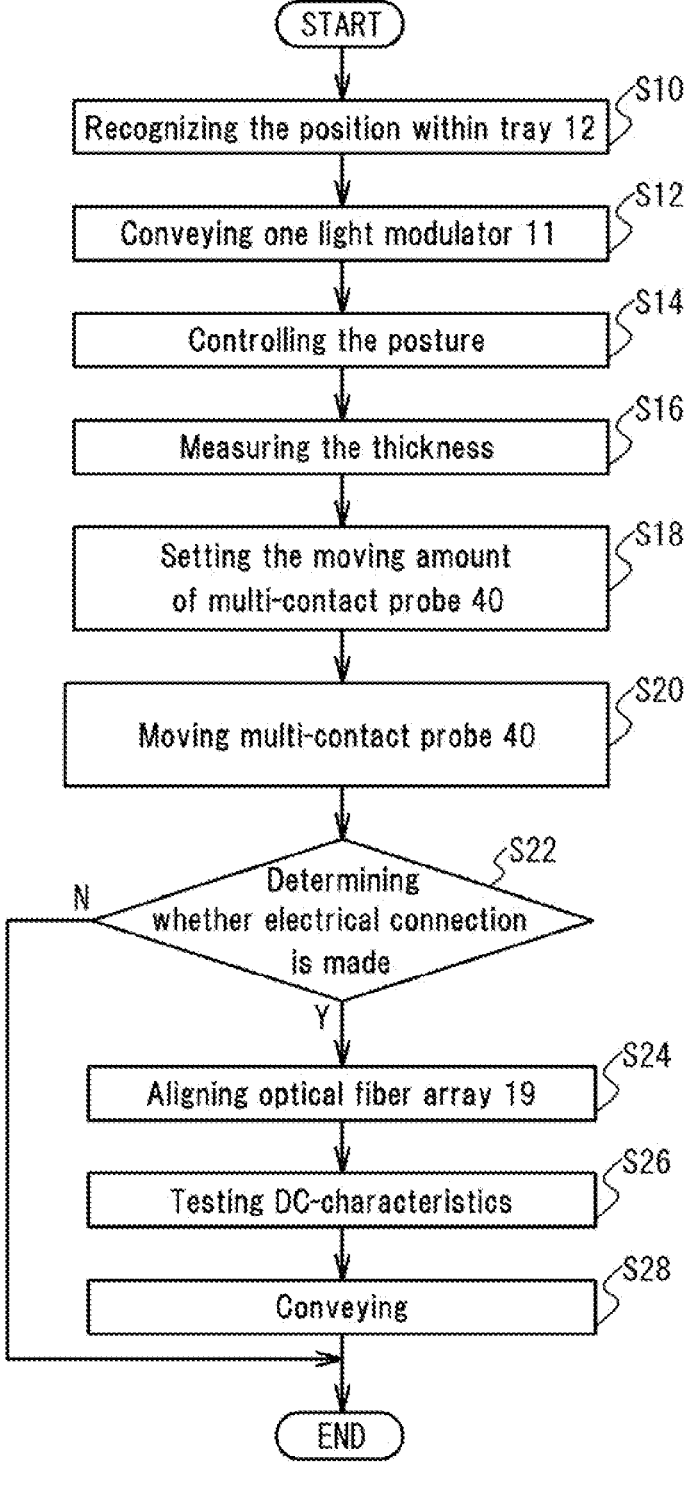
FIG. 5 illustrates a flow chart illustrating steps of the testing.

FIGS. 4 and 5 are flow charts illustrating the steps of the testing. A plurality of light modulators 11 are manufactured from one wafer. Light modulator 11 is manufactured from each of a plurality of wafers (such as a first wafer and a second wafer). As shown in FIG. 4, testing device 100 tests light modulator 11 manufactured from the first wafer (step S1), and tests light modulator 11 manufactured from the second wafer (step S2). Although two wafers are illustrated in FIG. 4, there may be three or more wafers. Variation occurs in the thickness of the optical modulator 11. The variation in thickness for each wafer is larger than the variation in thickness in one wafer, and is about 21.4 μm at the maximum as described above. According to the embodiment of the present disclosure, light modulators 11 of varying thickness can also be tested.

FIG. 5 is a flow chart illustrating the steps of testing one light modulator 11. In each step of FIG. 4, the process of FIG. 5 is performed for one light modulator 11. Camera 31 captures an image of light modulator 11 from the area above tray 12. Control unit 10 acquires an image from camera 31 and recognizes the position of light modulator 11 within tray 12 (step S10). Arm control unit 51 of control unit 10 operates arm 30 to convey one light modulator 11 placed on tray 12 to stage 20 (step S12). Posture control unit 52 controls the posture of light modulator 11 on stage 20 (step S14).

Measurement control unit 54 of control unit 10 measures the thicknesses of light modulators 11 using laser displacement meter 38 (step S16). As will be described later, the thickness of light modulator 11 is measured by irradiating the electrode of light modulator 11 on stage 20 with laser light. Movement control unit 55 of control unit 10 sets the moving amount of multi-contact probe 40 based on the thickness of light modulator 11 (step S18). Movement control unit 55 moves multi-contact probe 40 using movement unit 42 and brings it into contact with the electrode of light modulator 11 (step S20).

Power source control unit 57 of control unit 10 turns on the voltage of power source 39 to apply the voltage to light modulator 11 through multi-contact probe 40. Control unit 10 detects a voltage-current characteristic (V-I characteristic) of light modulator 11 to determine whether multi-contact probe 40 and light modulator 11 are electrically connected to each other (step S22). In case that the determination is negative (No), the process ends. In case that the determination is positive (Yes), step S24 is performed.

Alignment control unit 58 of control unit 10 moves optical fiber array 19 using alignment stage 18 to perform alignment with respect to light modulator 11 (step S24). Specifically, an input optical fiber of optical fiber array 19 is aligned with an incident port of light modulator 11. The output optical fiber of optical fiber array 19 is aligned with the output port of light modulator 11. Control unit 10 tests the electrical characteristics (DC-characteristics) of light modulator 11 (step S26). Light source control unit 56 of control unit 10 causes light source 14 to output light. The light propagates through the input optical fiber of optical fiber array 19 and enters light modulator 11. Testing unit 59 of control unit 10 acquires data measured by the light power meter and performs a characteristic test. Arm control unit 51 conveys light modulator 11 after the testing from stage 20 to tray 12 by using arm 30 (step S28). Thus, the testing process for one light modulator 11 is completed. The testing is performed on the plurality of light modulators 11.

Figure 6A:
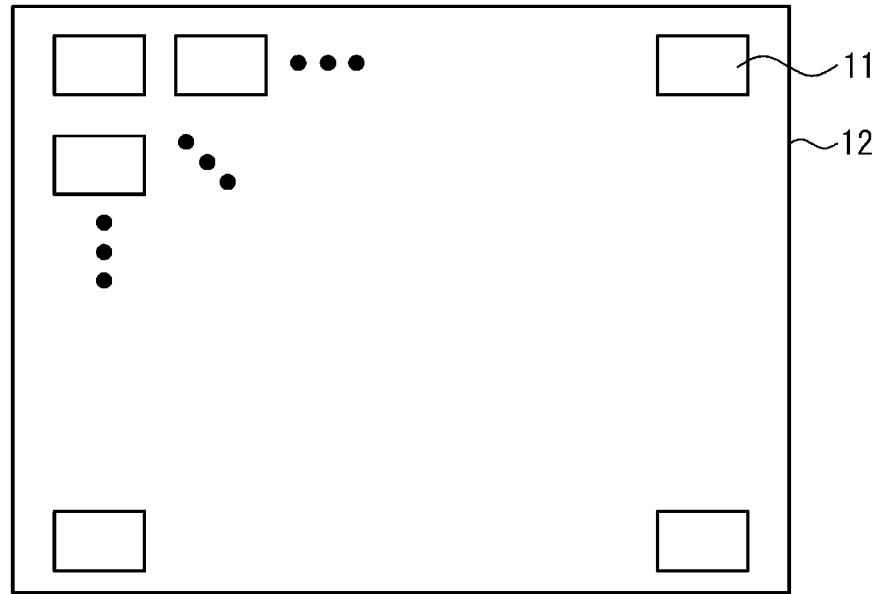
FIG. 6A illustrates the step of the testing.
Figure 6B:
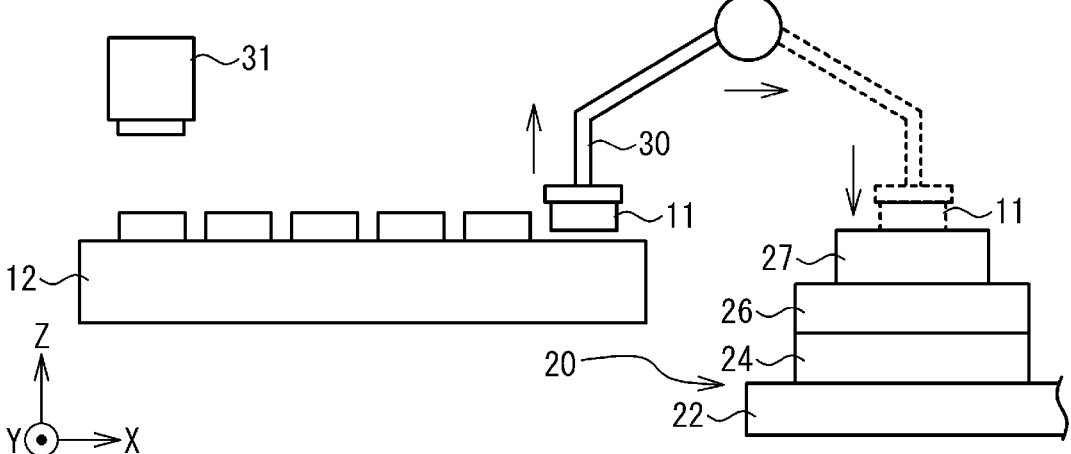
FIG. 6B illustrates the step of the testing.

FIGS. 6A-12B illustrate the steps of the testing. FIG. 6A is a plan view illustrating tray 12. As shown in FIG. 6A, a plurality of light modulators 11 are arranged in a two dimensional grid on tray 12. FIG. 6B is a side view illustrating tray 12 and stage 20. As shown in FIG. 6B, camera 31 images tray 12 from the area above tray 12. Control unit 10 detects the position of light modulator 11 on tray 12. Arm 30 sucks one of the plurality of light modulators 11 at its tip and picks up the light modulator. Arm 30 carries one light modulator 11 to stage 20. Stage 20 includes stages 22, 24 and 26, and a sample stage 27. Stage 24 is disposed on stage 22. Stage 26 is disposed on stage 24. Sample stage 27 is disposed on stage 26. Arm 30 places light modulator 11 on the upper face of sample stage 27 so that light modulator 11 is parallel to sample stage 27 (steps S10 and S12 in FIG. 5). After placement, arm 30 moves away from light modulator 11.

The direction in which stage and sample stage 27 overlap each other is taken as the Z-axis direction. Two sides of each of stage and sample stage 27 are parallel to the X-axis direction, and the other two sides are parallel to the Y-axis direction. The X-axis direction is the horizontal direction in FIG. 6B. The Z-axis direction is the vertical direction in FIG. 6B. The Y-axis direction is orthogonal to the X-axis direction and the Z-axis direction. The top faces of stage and sample stage 27 are parallel to the XY plane face. Stage 22 moves stage 24, stage 26, and sample stage 27 in the X-axis direction. Stage 24 moves stage 26 and sample stage 27 in the Y-axis direction. Stage 26 changes the angle of sample stage 27 in the XY plane face. The posture of light modulator 11 is controlled by the operation of the stage.

Figure 7A:
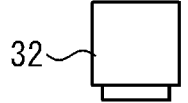
FIG. 7A illustrates the step of the testing.
Figure 7A:
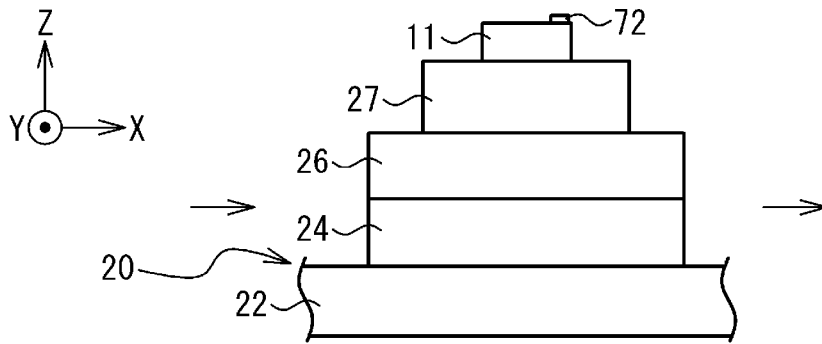
Figure 7B:
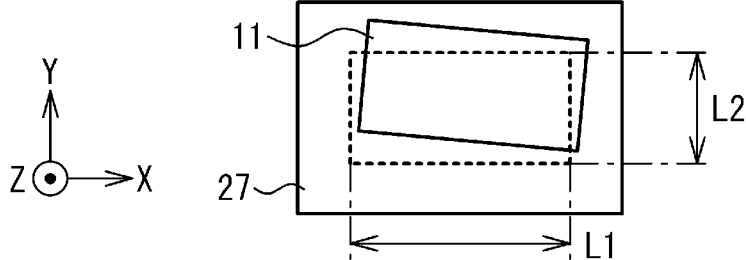
FIG. 7B illustrates the step of the testing.

FIGS. 7A and 7B are diagrams illustrating the process of posture control (step S14 in FIG. 5). FIG. 7A is a side view illustrating stage 20. As shown in FIG. 7A, stage 22 moves stage 24, stage 26 and sample stage 27 to position them under camera 32. The focal distance of camera 32 is, for example, 110 mm. Camera 32 is located above sample stage 27 and spaced apart from sample stage 27 by about the focal length. Camera 32 captures an image of light modulator 11.

FIG. 7B is a plan view illustrating sample stage 27. The dotted line represents a reference position of light modulator 11. The solid line is an example of the actual position of light modulator 11, and is shifted from the position of the dotted line. Control unit 10 stores the image of the reference position and operates stage 20 to control the posture of light modulator 11 to the reference position. The difference between the reference position and the actual position may be, for example, 1 μm or less. The length L1 of light modulator 11 in the X-axis direction is, for example, 4.3 mm. The length L2 in the Y-axis direction is, for example, 3 mm.

Figure 8A:
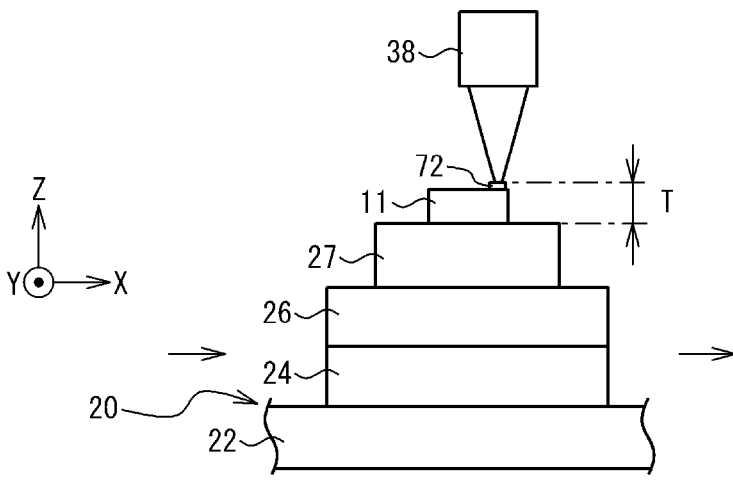
FIG. 8A illustrates the step of the testing.
Figure 8B:
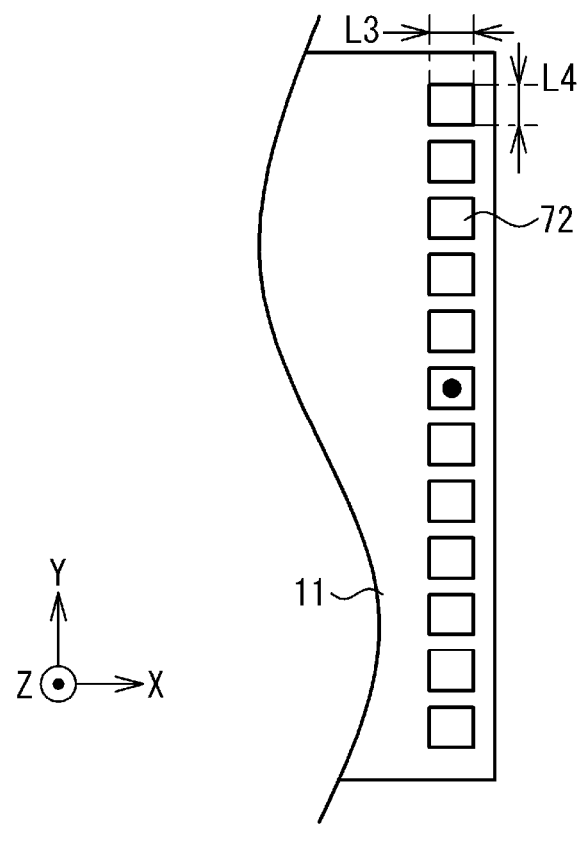
FIG. 8B illustrates the step of the testing.

FIGS. 8A and 8B illustrate a thickness-measuring process (step S16 in FIG. 5). FIG. 8A is a side view illustrating stage 20. As shown in FIG. 8A, stage 22 moves stage 24, stage 26 and sample stage 27 to position them under laser displacement meter 38. The distance from laser displacement meter 38 to electrode 72 of light modulator 11 is about the same as the focal distance of laser displacement meter 38, for example 10 mm. Laser displacement meter 38 irradiates electrode 72 of light modulator 11 with white laser light and measures the thickness T from the upper face of sample stage 27 to the upper face of electrode 72. The time required for one thickness measurement is several milliseconds. Control unit 10 stores the thickness T in storage device 64.

FIG. 8B is an enlarged plan view of the vicinity of electrode 72 of light modulator 11. As shown in FIG. 8B, a plurality of electrodes 72 are arranged along one side of light modulator 11. The flat face shape of electrode 72 is rectangular. The side lengths L3 and L4 of electrode 72 are, for example, 100 μm. One of the plurality of electrodes 72 is irradiated with laser light. Specifically, among the plurality of electrodes 72, the electrode near the central portion (in FIG. 8B, sixth electrode 72 from the top among twelve electrodes 72) is irradiated with the laser light. The laser light hits the central portion of electrode 72. The thickness of light modulator 11 at the central portion of electrode 72 is measured. The black circles in FIG. 8B represent spots of laser light. The spot diameter of the laser light is smaller than the length of electrode 72 and is, for example, 18 μm.

Figure 9:
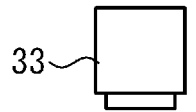
FIG. 9 illustrates the step of the testing.
Figure 9:
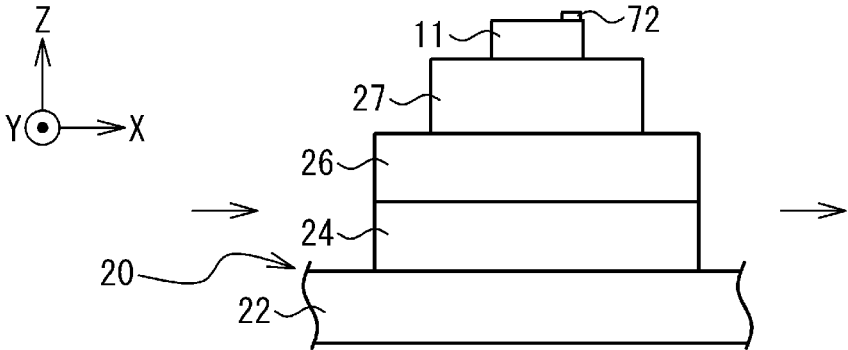

As shown in FIG. 9, after the thickness measurement, stage 22 moves light modulator 11 under camera 33 together with stage 24 and the like. Camera 33 captures an image of a number (such as a serial number) written on the surface of light modulator 11. Control unit 10 acquires the image of the number and stores it in storage device 64.

Figure 10A:
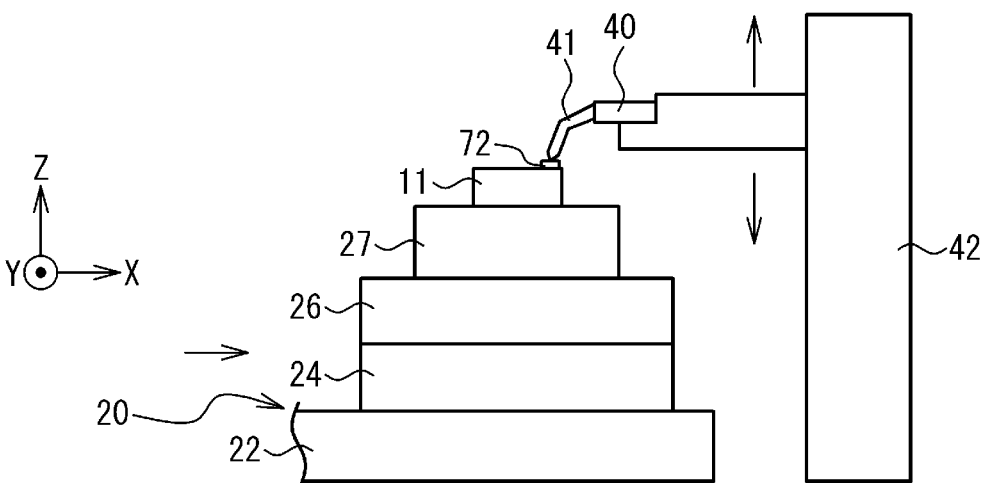
FIG. 10A illustrates the step of the testing.

FIGS. 10A to 12B illustrate the process of moving multi-contact probe 40 and conducting it with electrode 72 (steps S18 and S20 and of FIG. 5). As shown in FIG. 10A, multi-contact probe 40 is attached to movement unit 42 and has a probe needle 41. Probe needle 41 is formed of a metal such as tungsten (W). Stage 20 moves light modulator 11 to the vicinity of multi-contact probe 40 and movement unit 42. Movement unit 42 lowers multi-contact probe 40 to bring probe needle 41 into contact with the upper face of electrode 72.

Figure 10B:
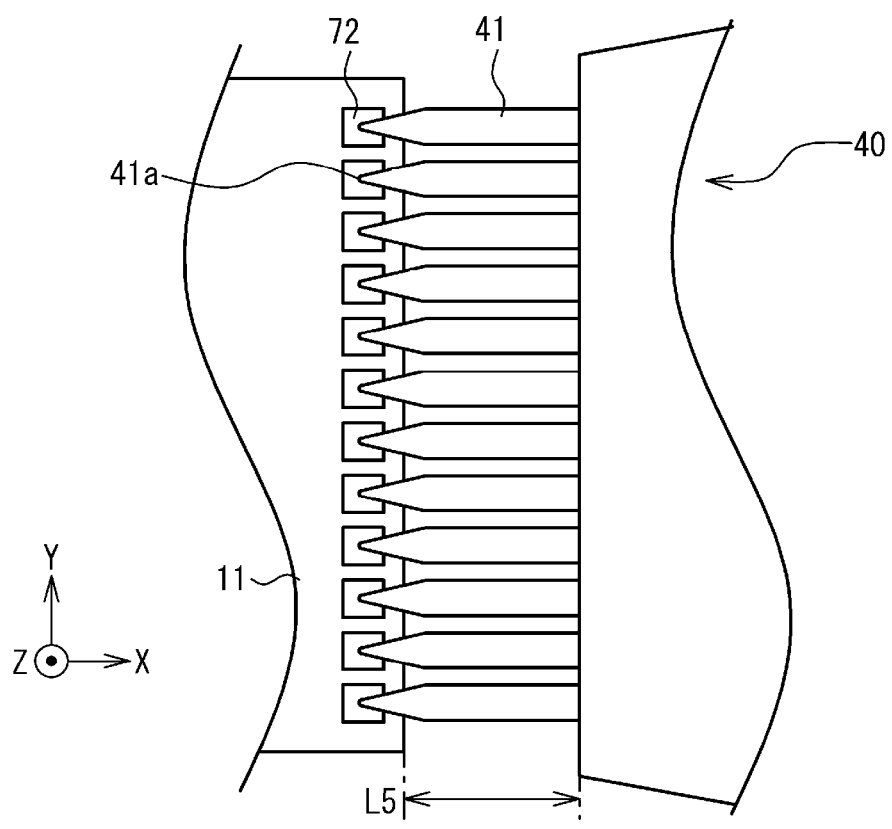
FIG. 10B illustrates the step of the testing.

FIG. 10B is an enlarged plan view of the vicinity of electrode 72 of light modulator 11. Light modulator 11 has a plurality of electrodes 72. Multi-contact probe 40 has a plurality of probe needles 41. Probe needle 41 comes into contact with each of the plurality of electrodes 72. That is, electrode 72 and probe needle 41 come into contact with each other on a one to-one basis. A tip 41a of probe needle 41 has a shape including a curved face. The radius of the curved face of tip 41a is, for example, 25 μm, which is smaller than the length of electrode 72. The length L5 of probe needle 41 in the X-axis direction is, for example, 3 mm. In FIG. 10B, the number of electrodes 72 and probe needles 41 is twelve. The number may be 12 or less, 12 or more, for example 18.

Figure 11A:
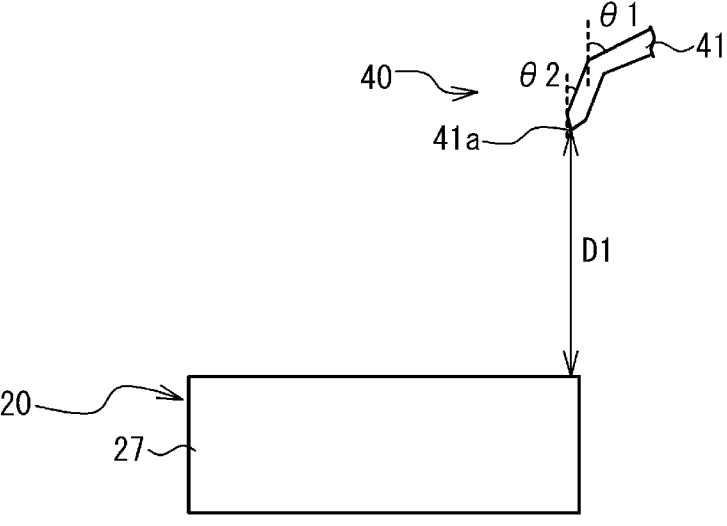
FIG. 11A illustrates the step of the testing.
Figure 11B:
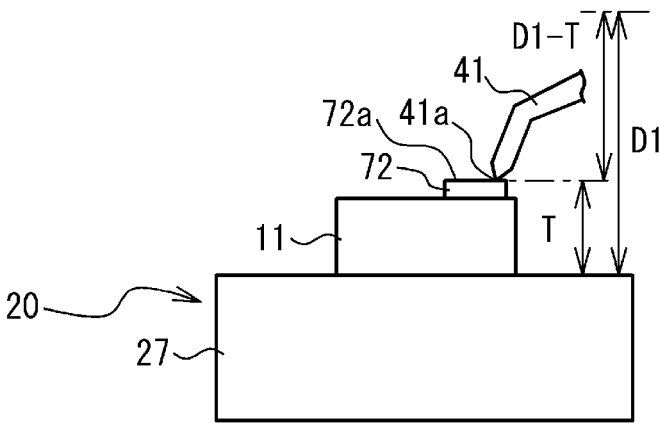
FIG. 11B illustrates the step of the testing.
Figure 11C:
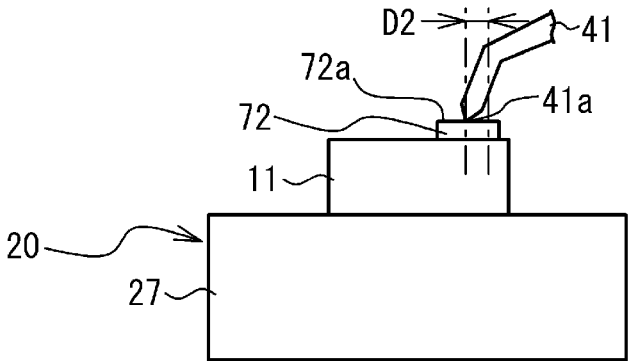
FIG. 11C illustrates the step of the testing.
Figure 12A:
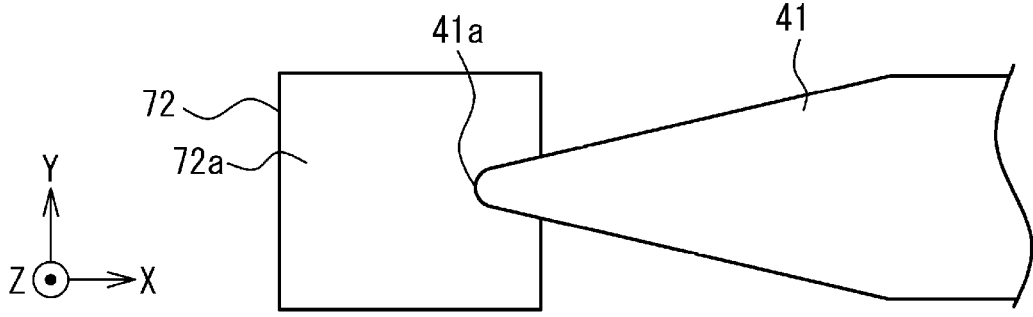
FIG. 12A illustrates the step of the testing.
Figure 12B:
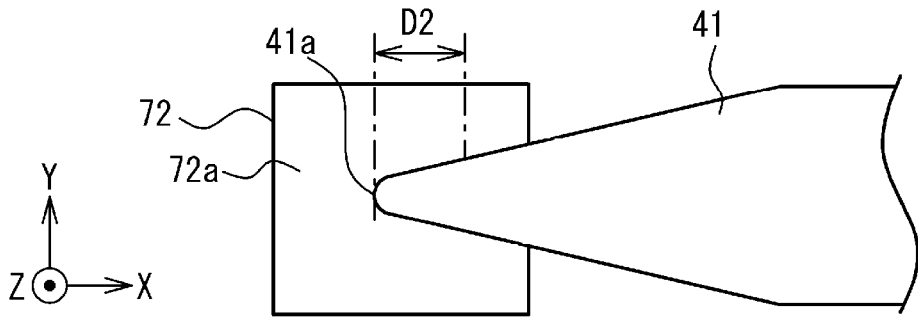
FIG. 12B illustrates the step of the testing.

FIGS. 11A to 11C are side views illustrating the movement of multi-contact probe 40. FIGS. 12A and 12B are plan views illustrating the movement of multi-contact probe 40, enlarging one probe needle 41.

As shown in FIG. 11A, probe needle 41 is bent in the middle and is inclined from the Z-axis direction and the direction. Probe needle 41 is inclined twice in the same direction with respect to the Z axis. The inclination angles from the Z axis are θ 1 and θ 2. The inclination angle θ 2 of probe needle 41 closer to a tip 41a is smaller than the inclination angle θ 1 of probe needle 41 farther from the tip inner wall. 81 and 82 are 90° or less.

Movement unit 42 aligns multi-contact probe 40, for example, before the start of a testing. Control unit 10 stores the distance D1 in storage device 64, the distance D1 being from the upper face of sample stage 27 to tip 41a of probe needle 41.

Movement control unit 55 of control unit 10 determines the moving amount P of multi-contact probe 40 (step S18 in FIG. 5). P is expressed by the following equation.

$$P = D1 - T + D2 \tag{1}$$

D1 is the distance between tip 41a before testing and the upper face of sample stage 27.

T is the thickness from the upper face of sample stage 27 to a face 72a of electrode 72.

The D2 is a predetermined value, for example, 50 μm.

As shown in FIG. 11B, in the testing, multi-contact probe 40 moves toward light modulator 11. Since Probe needle 41 moves by D1−T in the Z-axis direction from the stopped position of probe needle 41, tip 41a of probe needle 41 reaches face 72a of electrode 72. As shown in FIG. 12A, tip 41a contacts a part on the right side from the center of face 72a.

Movement unit 42 further moves probe needle 41 by a predetermined amount D2 while tip 41a contacts with face 72a of electrode 72. As shown in FIGS. 11C and 12B, tip 41a slides within face 72a and moves to the central portion of face 72a (overdrive). The sliding amount (overdrive amount) of tip 41a is the amount D2. The overdrive increases a force applied from probe needle 41 to electrode 72, so that tip 41a and face 72a are stably brought into contact with each other. Electrode 72 and probe needle 41 are electrically connected to each other.

According to an embodiment of the present disclosure, testing device 100 includes laser displacement meter 38. Laser displacement meter 38 is a non-contact device and measures the thickness of light modulator 11. Probe needle 41 of multi-contact probe 40 moves by a distance corresponding to the thickness to come into contact with electrode 72 of light modulator 11. The moving amount of probe needle 41 is determined based on the thickness. The moving amount is an appropriate amount that is neither too small nor too large. Contact failure between probe needle 41 and electrode 72 is suppressed. Destruction of electrode 72 due to probe needle 41 being pushed into electrode 72 is also suppressed. Good contact between probe needle 41 and electrode 72 is possible.

As shown in FIG. 11A, movement unit 42 places multi-contact probe 40 above sample stage 27 of stage 20. D1 is a distance from tip 41a of probe needle 41 to sample stage 27. The moving amount P of probe needle 41 is determined according to the distance D1 and the thickness T of light modulator 11. Since the moving amount P corresponds to the thickness T, good contact between probe needle 41 and electrode 72 is possible.

The moving amount P is expressed as $P=D1-T+D2$ using the distance D1, thickness T, and the predetermined amount D2. Probe needle 41 descends to face 72*a* of electrode 72 and slides within face 72*a*. Good contact between probe needle 41 and electrode 72 is possible. The predetermined amount D2 may be determined according to the size of electrode 72. When the length of one side of electrode 72 is 100 μm, the D2 is 100 μm or less, for example, 50 μm. Probe needle 41 does not slide to the outside of electrode 72 and comes into contact with electrode 72.

Light modulator 11 is manufactured from a wafer. Thickness T is likely to vary between wafers. As shown in FIG. 4, testing device 100 tests light modulators 11 manufactured from different wafers. Control unit 10 measures the thickness of light modulator 11 manufactured from the first wafer and determines the moving amount P. Control unit 10 measures the thickness of light modulator 11 manufactured from the second wafer and determines the moving amount P. It is possible to test light modulators 11 manufactured from different wafers.

The thickness measurement may be performed on one of the plurality of light modulators 11 manufactured from one wafer. That is, the thickness of one light modulator 11 manufactured from the first wafer is measured, and the moving amount is set (steps S16 and S18 in FIG. 5). In other light modulators 11, the measurement of the thickness and the setting of the moving amount are not performed. The moving amount is applied to all light modulators 11 of the first wafer. For light modulator 11 manufactured from the second wafer, measurement of the thickness and setting of the moving amount are performed. The man-hour is reduced, and the testing time is shortened. The thickness measurement may be performed on all light modulators 11.

Light modulator 11 has a plurality of electrodes 72. Laser displacement meter 38 may irradiate at least one of the plurality of electrodes 72 with laser light. Laser displacement meter 38 may irradiate two or more electrodes 72 with laser light, or may irradiate one electrode 72 with laser light. By irradiating one electrode 72 with laser light and measuring the thickness, the process time can be shortened.

Multi-contact probe 40 has a plurality of probe needles 41. The plurality of probe needles 41 move and come into contact with the plurality of electrodes 72. Light modulator 11 can be tested. The number of probe needles 41 may be equal to or more than the number of electrodes 72. Multi-contact probe 40 is electrically connected to all electrodes 72 of light modulator 11.

As shown in FIG. 8B, laser displacement meter 38 irradiates the central portion of electrode 72 with laser light. Measurement control unit 54 measures the thickness of light modulator 11 at the central portion of electrode 72. Probe needle 41 moves a distance corresponding to the thickness and moves to the center of electrode 72 to come into contact with electrode 72, as shown in FIG. 12B. Stable contact is possible. The irradiation position of the laser light and the stopped position of probe needle 41 may be the central portion of electrode 72 or may be a position deviated from the central portion, for example, the vicinity of an end portion.

When probe needle 41 is moved downward by a predetermined amount D2 in a state where probe needle 41 is in contact with face 72*a* of electrode 72, tip 41*a* moves on face 72*a*. When tip 41*a* is pressed against face 72*a*, probe needle

41 and electrode 72 are brought into contact with each other. Since probe needle 41 is inclined from the Z-axis, probe needle 41 is easily overdriven. When the pressure from probe needle 41 has an appropriate amount, breakage of electrode 72 due to the pressure from probe needle 41 is suppressed. Since tip 41*a* includes a spherical face, electrode 72 is not easily damaged.

Testing device 100 tests light modulator 11. The test object may be an electronic device other than light modulator 11. The electrode may be provided on the surface of the test object and may be in contact with probe needle 41. The number and size of probe needles 41 are determined in accordance with the number and size of electrodes 72. Control unit 10 includes a computer and automatically performs the steps of FIG. 5. The workload is reduced.

Although the embodiments of the present disclosure have been described in detail above, the present disclosure is not limited to the specific embodiments, and various modifications and changes can be made within the scope of the gist of the present disclosure described in the claims.

What is claimed is:

1. A testing apparatus comprising:
   (a) a stage having an upper surface and configured to support a test object that includes an electrode having an upper surface;
   (b) a probe assembly including a probe needle having a tip;
   (c) a motor-driven actuator mechanically coupled to the probe assembly and configured to move the probe needle along a vertical axis toward and away from the stage;
   (d) a laser displacement sensor oriented to direct laser light to the electrode and to output measurement data indicative of a distance from the laser displacement sensor to the upper surface of the electrode; and
   (e) a controller comprising a processor and a non-transitory memory storing instructions that, when executed by the processor, cause the controller to:
      (i) with the probe needle positioned above the stage and separated from the test object, control the laser displacement sensor to measure a thickness T defined as a distance from the upper surface of the stage to the upper surface of the electrode;
      (ii) determine a movement amount P according to $P=D1-T+D2$, where D1 is a stored distance from the tip to the upper surface of the stage when the probe needle is positioned above the stage and separated from the test object, and D2 is a predetermined overdrive amount; and
      (iii) drive the motor-driven actuator to move the probe needle by the movement amount P such that the tip contacts the electrode and, after contact, advances by the predetermined overdrive amount to slide on a surface of the electrode toward a central portion of the electrode.

2. The testing apparatus according to claim 1, further comprising:
   the stage,
   wherein the controller is
   configured to position the probe needle
   above the stage and separated from the test object, and to drive the motor-driven actuator to move the probe needle by the movement amount P determined in accordance with the thickness T, the stored distance D1 from the tip to the upper surface of the stage, and the predetermined overdrive amount D2.

3. The testing apparatus according to claim 2, wherein the controller is configured to determine the movement amount P by adding the predetermined overdrive amount D2 to a difference between the stored distance D1 and the thickness T, according to P=D1−T+D2, and to drive the motor-driven actuator to move the probe needle by the movement amount P.

4. The testing apparatus according to claim 1, wherein the test object includes a plurality of the electrodes, and the laser displacement sensor is configured to measure the thickness T by directing the laser light to at least one electrode of the plurality of the electrodes.

5. The testing apparatus according to claim 4, wherein the probe assembly includes a plurality of the probe needles, and the controller is configured to drive the motor-driven actuator such that the plurality of probe needles move in accordance with the thickness T to come into contact with the plurality of the electrodes.

6. The testing apparatus according to claim 4, wherein the laser displacement sensor is configured to measure the thickness T by directing the laser light to a central portion of the at least one electrode of the plurality of the electrodes.

7. The testing apparatus according to claim 1, wherein the test object is a light modulator.

8. The testing apparatus of claim 1, wherein the test object includes a plurality of electrodes and the probe assembly includes a plurality of probe needles corresponding to the plurality of electrodes, and wherein the controller is configured to control the laser displacement sensor to measure the thickness T by directing the laser light to only one of the plurality of electrodes and to determine the movement amount P for moving the plurality of probe needles based on the thickness measured for the one electrode.

9. The testing apparatus of claim 1, wherein the controller is further configured, after driving the motor-driven actuator so the probe needle contacts the electrode, to (i) apply a predetermined voltage between the probe needle and the electrode, (ii) measure a current responsive to the predetermined voltage, and (iii) determine whether electrical contact between the probe needle and the electrode is established based on a measured current-voltage characteristic, before performing a subsequent electrical test of the test object.

10. A testing method comprising:
supporting, on a stage having an upper surface, a test object including an electrode having an upper surface;
positioning a probe needle above the stage and separated from the test object;
directing laser light from a laser displacement sensor to the electrode and outputting measurement data indicative of a distance from the laser displacement sensor to the upper surface of the electrode;
measuring, based on the measurement data, a thickness T defined as a distance from the upper surface of the stage to the upper surface of the electrode;
determining a movement amount P according to P=D1−T+D2, where D1 is a stored distance from a tip of the probe needle to the upper surface of the stage when the probe needle is positioned above the stage and separated from the test object, and D2 is a predetermined overdrive amount; and
driving a motor-driven actuator mechanically coupled to a probe assembly to move the probe needle by the movement amount P such that the tip contacts the electrode and, after contact, advances by the predetermined overdrive amount to slide on a surface of the electrode toward a central portion of the electrode.

11. A non-transitory storage medium storing a testing program for causing a computer to function as:
a measurement control unit configured to control a laser displacement sensor to direct laser light to an electrode of a test object and to output measurement data indicative of a distance from the laser displacement sensor to an upper surface of the electrode, and to measure, based on the measurement data, a thickness T defined as a distance from an upper surface of a stage to the upper surface of the electrode; and
a movement control unit configured to determine a movement amount P according to P=D1−T+D2, where D1 is a stored distance from a tip of a probe needle to the upper surface of the stage when the probe needle is positioned above the stage and separated from the test object, and D2 is a predetermined overdrive amount, and to drive a motor-driven actuator to move the probe needle by the movement amount P such that the tip contacts the electrode and, after contact, advances by the predetermined overdrive amount to slide on a surface of the electrode toward a central portion of the electrode.

\*    \*    \*    \*    \*